United States Patent
Tan et al.

(10) Patent No.: US 10,545,174 B2
(45) Date of Patent: Jan. 28, 2020

(54) KELVIN CONTACT FINGER FOR HIGH CURRENT TESTING

(71) Applicants: Natali Tan, Singapore (SG); Melisa Tan, Singapore (SG)

(72) Inventors: Natali Tan, Singapore (SG); Melisa Tan, Singapore (SG)

( * ) Notice: Subject to any disclaimer, the term of this patent is extended or adjusted under 35 U.S.C. 154(b) by 0 days.

(21) Appl. No.: 16/121,650

(22) Filed: Sep. 5, 2018

(65) Prior Publication Data

US 2019/0072583 A1    Mar. 7, 2019

(30) Foreign Application Priority Data

Sep. 5, 2017  (SG) .............................. 10201707216S

(51) Int. Cl.
  *G01R 1/04*    (2006.01)
  *G01R 31/28*   (2006.01)
  *G01R 1/067*   (2006.01)

(52) U.S. Cl.
  CPC ....... *G01R 1/0458* (2013.01); *G01R 1/06716* (2013.01); *G01R 31/2891* (2013.01)

(58) Field of Classification Search
  CPC .. G01R 1/07314; G01R 1/06738; G01R 3/00; G01R 1/06733; G01R 1/06772; G01R 1/07371
  USPC ........................ 324/755.04, 755.01, 537, 500
  See application file for complete search history.

(56) References Cited

U.S. PATENT DOCUMENTS 9,261,537 B2 *  2/2016  Edwards ............ G01R 1/07307
9,274,141 B1 *  3/2016  Andres .............. G01R 1/06738
9,343,830 B1 *  5/2016  Landa ................ H01R 13/2414
2007/0018664 A1  1/2007  Bae et al.
2013/0093446 A1  4/2013  Mochizuki et al.
2013/0249583 A1  9/2013  Kuong et al.

FOREIGN PATENT DOCUMENTS

JP    2001-159641 A    6/2001

OTHER PUBLICATIONS

Search Report of Singapore Patent Application No. 10201807617P dated Aug. 7, 2019 (4 pages).

* cited by examiner

*Primary Examiner* — Giovanni Astacio-Oquendo
(74) *Attorney, Agent, or Firm* — Pyprus Pte Ltd

(57) ABSTRACT

A Kelvin socket 10 comprising a housing 1 having a recess, a plurality of socket pin slots or partitions 11 resided in the recess, and a cooling medium pass 7; a plurality of self-cooling force contact fingers 2 arranged into an array and disposed into the plurality of socket pin slots or partitions 11 of the housing 1; wherein each of the plurality of self-cooling force contact fingers 2 has a force contact finger pin 21 and a heat sink base 22 being attached to a portion away from tip of the force contact finger pin 21 for dissipating heat from the force contact finger pin 21; an elastomer 3 disposed on the self-cooling force contact fingers 2; a plurality of sense contact fingers 4 having a plurality of sense contact finger pins 41, and being arranged into an array; wherein each of the plurality of sense contact fingers has a sense contact finger pin 41; wherein the plurality of sense contact fingers 5 are disposed into the elastomer 3, resulting in that the plurality of sense contact finger pins 41 are arranged in adjacent parallelly to the force contact finger pins 21; and a cover 5 disposed upon the sense contact fingers 4.

10 Claims, 6 Drawing Sheets

KELVIN CONTACT FINGER FOR HIGH CURRENT TESTING

FIELD OF THE INVENTION

The present invention generally relates to the technologies for testing electrical devices, and more particularly to a Kelvin contact finger for high current testing, and a Kelvin socket containing the same.

BACKGROUND OF THE INVENTION

Kelvin sockets are widely adapted for electrical component testing, especially in integrated circuit (IC) testing. In the final high current Kelvin test, tips of the Kelvin contact fingers/pins wear off easily as the pins are "scrubbing" against the integrated circuit leads under high temperature after a few thousands life cycles test. Due to high temperature caused by high current, extra strain to fingers/pins is caused comparing to normal test.

It is therefore desired that such a problem is reduced or eliminated to extend the lifespan of the contact pins.

SUMMARY OF THE INVENTION

One aspect of the present invention provides a Kelvin socket. In one embodiment, the Kelvin socket comprises:

a housing having a recess, a plurality of socket pin slots or partitions resided in the recess, and a cooling medium pass;

a plurality of self-cooling force contact fingers arranged into an array and disposed into the plurality of socket pin slots or partitions of the housing; wherein each of the plurality of self-cooling force contact fingers has a force contact finger pin and a heat sink base being attached to a portion away from tip of the force contact finger pin for dissipating heat from the force contact finger pin;

an elastomer disposed on the self-cooling force contact fingers;

a plurality of sense contact fingers having a plurality of sense contact finger pins, and being arranged into an array; wherein each of the plurality of sense contact fingers has a sense contact finger pin; wherein the plurality of sense contact fingers are disposed into the elastomer, resulting in that the plurality of sense contact finger pins are arranged in adjacent parallelly to the force contact finger pins; and a cover disposed upon the sense contact fingers; whereby when the Kelvin socket is assembled, the cover holds the Kelvin socket together.

In another embodiment of the Kelvin socket, the force contact finger pins and heat sink bases are bonded together by welding, bristling, or solder.

In another embodiment of the Kelvin socket, the heat sink base has a traverse through hole in the traverse dimension of the heat sink base; wherein when the self-cooling contact fingers are installed in an array form on the housing, the traverse through holes align with each other to form a through path allowing a cooling medium to flow therethrough to cool down the heat sink base, thereby cooling down the self-cooling force contact fingers.

In another embodiment of the Kelvin socket, the heat sink base has a longitudinal channel formed in the longitudinal dimension of the heat sink base, wherein the longitudinal channel runs across the traverse through hole and along the length of the force contact pins.

In another embodiment of the Kelvin socket, the elastomer is made of silicone.

Another aspect of the present invention provides a self-cooling force contact finger suitable for being employed in a Kelvin socket. In one embodiment, the self-cooling force contact finger comprises:

a force contact finger pin; and a heat sink base being attached to a portion away from tip of the force contact finger pin for dissipating heat from the force contact finger pin.

In another embodiment of the self-cooling force contact finger, the force contact finger pins and heat sink bases are bonded together by welding, bristling, or solder.

In another embodiment of the self-cooling force contact finger, the heat sink base has a traverse through hole in the traverse dimension of the heat sink base.

In another embodiment of the self-cooling force contact finger, the heat sink base has a longitudinal channel formed in the longitudinal dimension of the heat sink base, wherein the longitudinal channel runs across the traverse through hole and along the length of the force contact pins.

The objectives and advantages of the invention will become apparent from the following detailed description of preferred embodiments thereof in connection with the accompanying drawings.

BRIEF DESCRIPTION OF THE DRAWINGS

Preferred embodiments according to the present invention will now be described with reference to the Figures, in which like reference numerals denote like elements.

DETAILED DESCRIPTION OF THE INVENTION

The present invention may be understood more readily by reference to the following detailed description of certain embodiments of the invention.

Throughout this application, where publications are referenced, the disclosures of these publications are hereby incorporated by reference, in their entireties, into this application in order to more fully describe the state of art to which this invention pertains.

The present invention provides a Kelvin socket comprising a cooling means. In brief, the cooling means acts as a heat sink to dissipate heat of force contact finger pins. With the cooling means, the force contact finger pins are protected from over-heating during testing, thereby increasing the lifespan of the force contact fingers.

Figure 1:
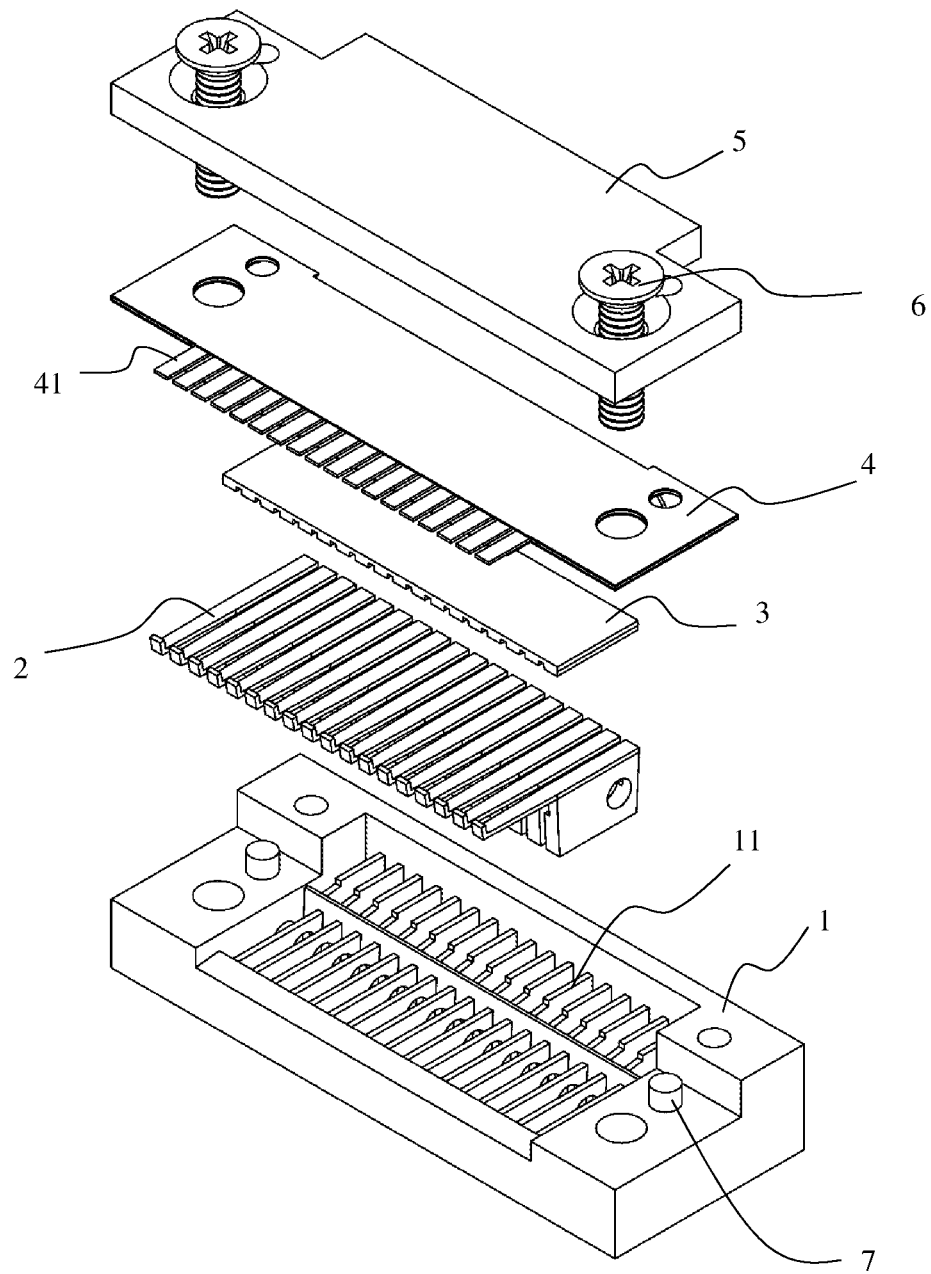
FIG. 1 shows an exploded view of Kelvin socket in accordance with one embodiment of the present invention.

FIG. 1 shows an exploded view of a Kelvin socket in accordance with one embodiment of the present invention. As shown in FIG. 1, the Kelvin socket 10 comprises a housing 1, a plurality of self-cooling force contact fingers 2, an elastomer 3, a plurality of sense contact fingers 4, and a cover 5.

The housing 1 has a recess and a cooling medium pass 7. The suitable material for the housing 1 includes insulating engineering plastic. The housing 1 is molded to desired shape and size with accurate repeatability and tolerance, and able to withstand heat generated from high current. The housing 1 includes a plurality of socket pin slots or partitions 11 resided in the recess. The plurality of socket pin slots or partitions 11 reduce leakage between contact pins due to good dissipation of electricity, separate contact pins from one another to prevent short circuit between pin to pin, guide the contact pins to align precisely to IC/device leads because contact pins not properly aligned will not get good contact to IC/device leads, and separate the Kelvin Force pin from the Kelvin Sense pin to prevent Kelvin short circuit which is undesirable and defeats purpose of conducting Kelvin test.

The plurality of self-cooling force contact fingers 2 are arranged into an array and disposed into the plurality of socket pin slots or partitions 11 of the housing 1.

Figure 2:
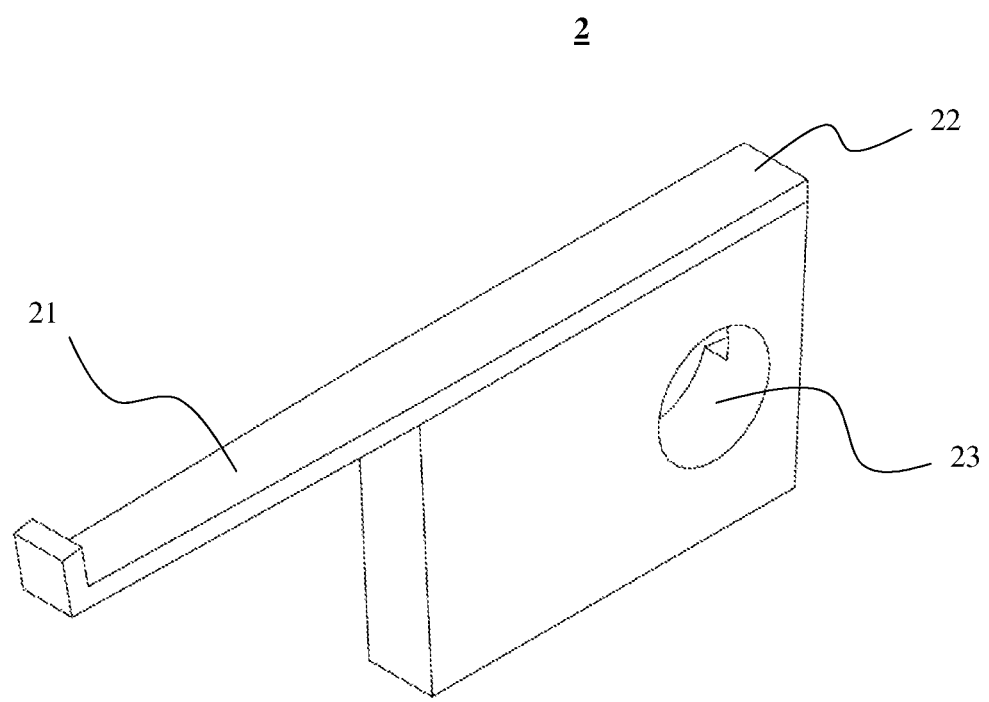
FIG. 2 shows a perspective view of the self-cooling force contact finger in accordance with one embodiment of the present invention.
Figure 5:
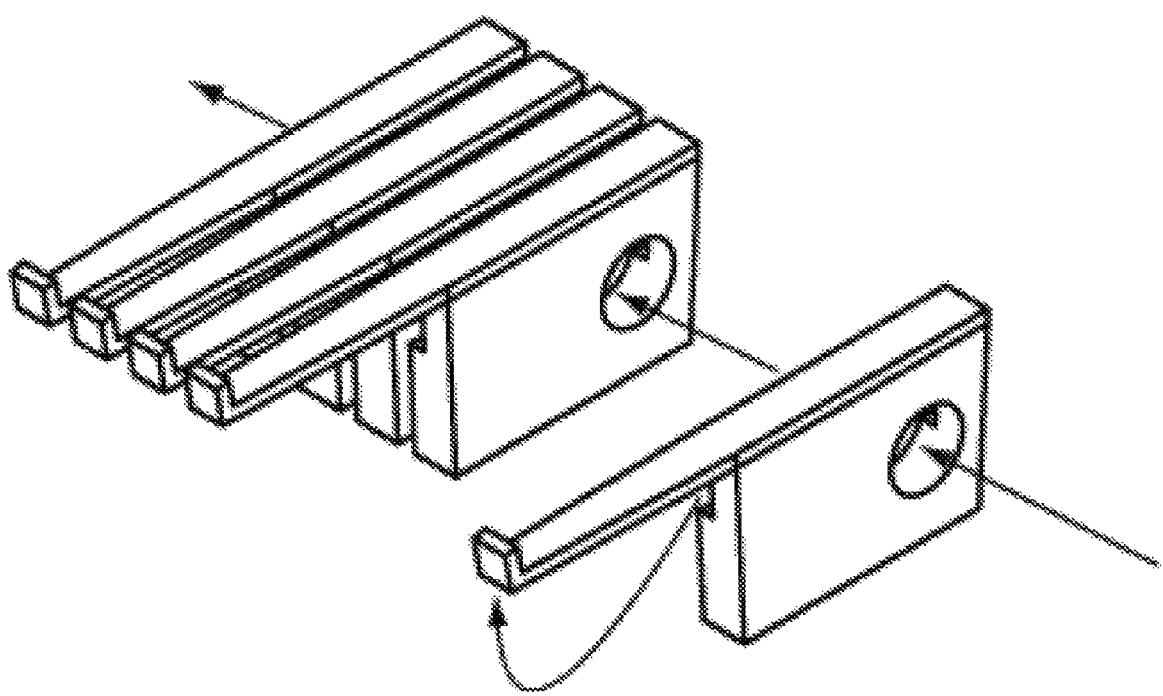
FIG. 5 illustrates the direction of cooling medium as represented by the arrows.

Referring now to FIG. 2, there is provided a perspective view of a self-cooling force contact finger in accordance with one embodiment of the present invention. As shown in FIG. 2, each of the plurality of self-cooling force contact fingers 2 has a force contact finger pin 21 and a heat sink base 22 being attached to the portion away from the tip of the force contact finger pin 21 for dissipating heat from the force contact finger pin 21. The force contact finger pins 21 and heat sink base 22 may be bonded together through various methods such as welding, bristling, solder etc. The heat sink base 22 has a traverse through hole 23 in the traverse dimension of the heat sink base 22. When the self-cooling contact fingers 22 are installed in an array form on the housing 1, the traverse through holes 23 align with each other to form a through path as shown in FIG. 5. Such a through path allows a cooling medium to flow therethrough to cool down the heat sink base 22 fast, thereby cooling down the self-cooling force contact fingers 2 effectively. The suitable cooling medium includes fluid, air, or cold air. In one example, noble gas can be used for extremely high current test. Operationally, the heat sink base 22 is maintained at relatively low temperature due to its large surface area to dissipate heat, and the cooling medium such as cold air is pumped into the heat sink base 22 for keeping its temperature low.

Figure 3:
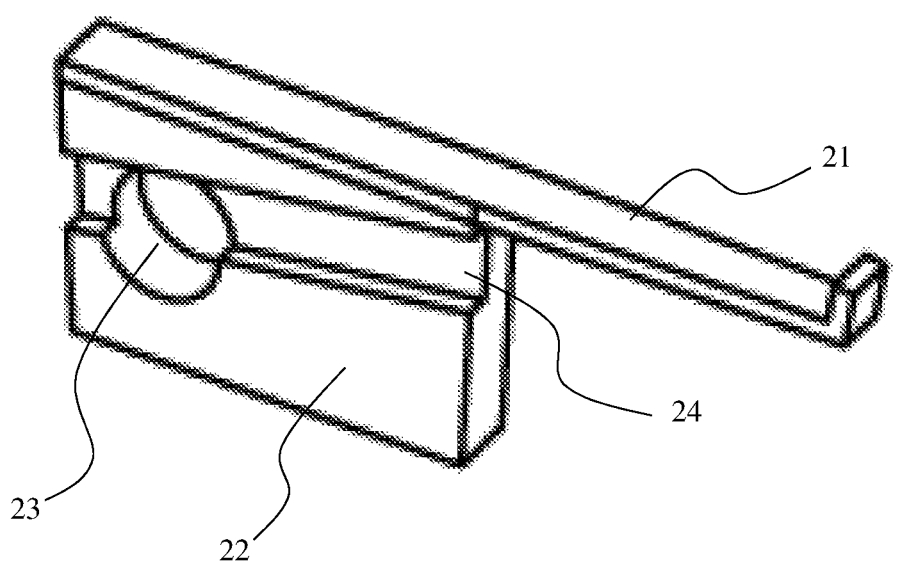
FIG. 3 shows a perspective view of the self-cooling force contact finger in accordance with another embodiment of the present invention.
Figure 6:
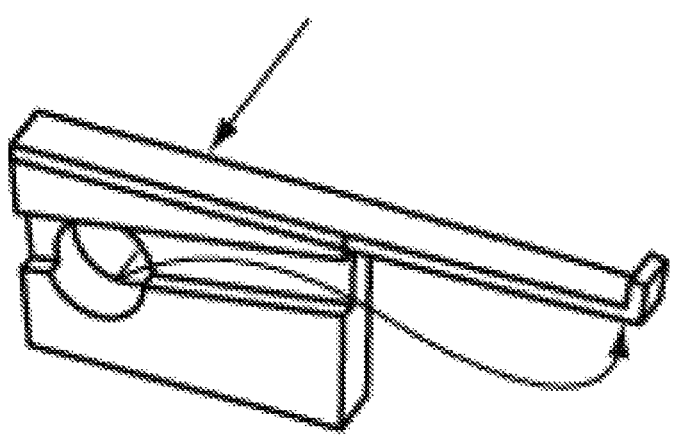
FIG. 6 illustrates the direction of the cooling medium as represented by the arrows.

Referring now to FIG. 3, there is provided a perspective view of a self-cooling force contact finger in accordance with another embodiment of the present invention. As shown in FIG. 3, the self-cooling force contact finger 2 is similar to the one shown in FIG. 2 except for a longitudinal channel 24 formed in the longitudinal dimension of the heat sink base 22. The longitudinal channel 24 runs across the traverse through hole 23 and along the length of the force contact pins 21. Cooling medium such as cold air passes through the traverse through path, and a portion of the passing cooling medium is further directed towards the tip of the force contact pins 21 as shown in FIG. 6. A skilled person would appreciate that when the self-cooling force contact fingers are inserted into the Kelvin socket with the traverse through holes of each heat sink base aligned, cooling medium such as cold air may be supplied through the longitudinal channels to cool down the heat sink base thereby reducing the temperature of the self-cooling force contact fingers 2. It is to be noted that the longitudinal channel 24 can be formed at any location of the heat sink base 22 as long as it opens to the traverse through hole 23.

The elastomer 3 is disposed on the self-cooling force contact fingers 2. In certain embodiments, the elastomer 3 is made of silicone. The elastomer 3 made of silicone helps preventing air leak.

The plurality of sense contact fingers 4 have a plurality of sense contact finger pins 41, and are arranged into an array; each of the plurality of sense contact fingers has a sense contact finger pin 41. The plurality of sense contact fingers 4 are disposed into the elastomer 3, resulting in that the plurality of sense contact finger pins 41 are arranged in adjacent parallelly to the force contact finger pins 21. The elastomer 3 separates the parallelly configured force contact finger pins 21 from the sense contact finger pins 41.

The force contact fingers 2 and sense contact fingers 4 are with replaceable pins, thus, not needing to replace the whole socket. The force contact fingers 2 and sense contact fingers 4 can be made from any conductive material with good conductivity and elasticity.

The cover 5 is disposed upon the sense contact fingers 4. In one embodiment, the cover 5 is assembled into the Kelvin socket by a screw 6. The cover 5 can be any kind of material as long it can securely hold all components in place.

Figure 4:
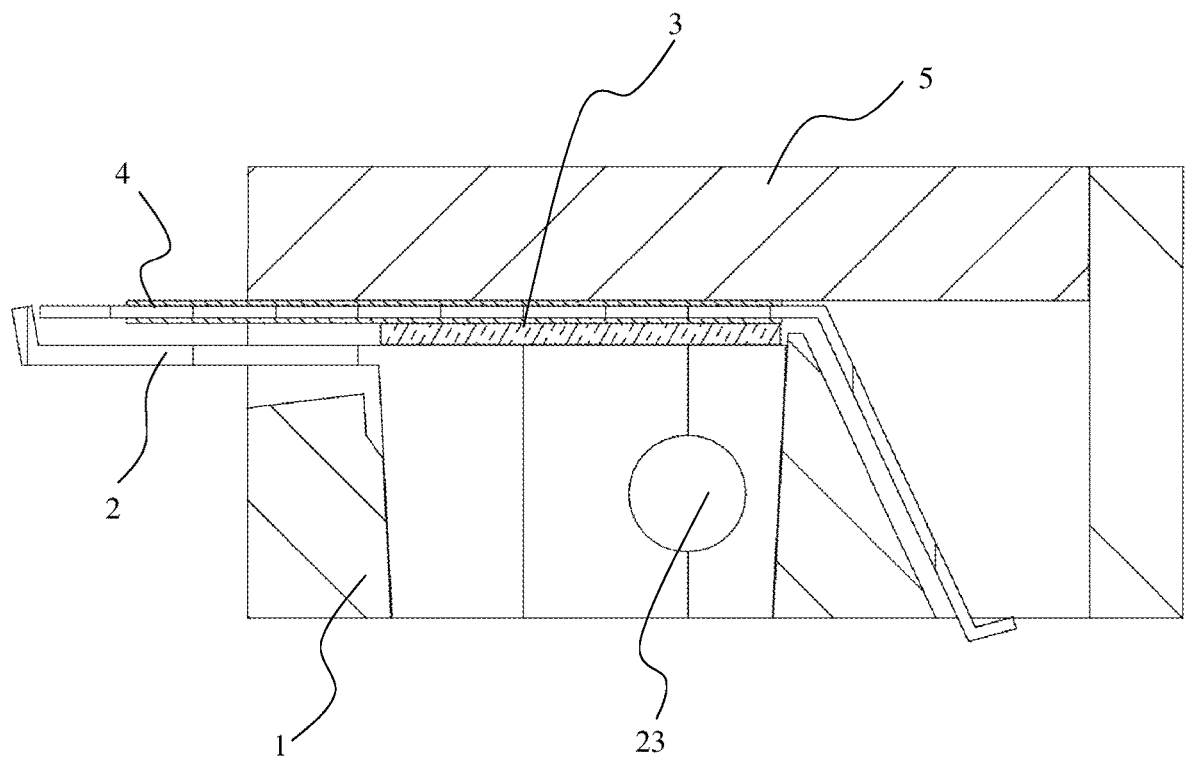
FIG. 4 shows a cross-sectional view of the assembled Kelvin socket as shown in FIG. 1.

Referring now to FIG. 4, there is provided a cross sectional view of an assembled Kelvin socket in accordance with one embodiment of the present invention. As shown in FIG. 4, a silicone elastomer 3 insulates a self-cooling force contact finger pin 2 from the sense contact finger pin 4 and the elasticity of the elastomer gives the sense contact finger pin "Spring Effect" and the sense contact finger pin will release back to the original position.

In another embodiment, the components of the Kelvin socket can be made of non-metal material suitable for carrying out High Potential (HIPOT) testing, which is a non-destructive test to determine the adequacy of electrical insulation between contact pins.

While the present invention has been described with reference to particular embodiments, it will be understood that the embodiments are illustrative and that the invention scope is not so limited. Alternative embodiments of the present invention will become apparent to those having ordinary skill in the art to which the present invention pertains. Such alternate embodiments are considered to be encompassed within the scope of the present invention. Accordingly, the scope of the present invention is defined by the appended claims and is supported by the foregoing description.

What is claimed is:

1. A Kelvin socket comprising:
    a housing having a recess, a plurality of socket pin slots or partitions resided in the recess, and a cooling medium pass;
    a plurality of self-cooling force contact fingers arranged into an array and disposed into the plurality of socket pin slots or partitions of the housing; wherein each of the plurality of self-cooling force contact fingers has a force contact finger pin and a heat sink base being attached to a portion away from tip of the force contact finger pin for dissipating heat from the force contact finger pin;
    an elastomer disposed on the self-cooling force contact fingers;
    a plurality of sense contact fingers having a plurality of sense contact finger pins, and being arranged into an array; wherein each of the plurality of sense contact fingers has a sense contact finger pin; wherein the plurality of sense contact fingers are disposed into the elastomer, resulting in that the plurality of sense contact finger pins are arranged in adjacent parallelly to the force contact finger pins; and a cover disposed upon the sense contact fingers; whereby when the Kelvin socket is assembled, the cover holds the Kelvin socket together.

2. The Kelvin socket of claim 1, wherein the force contact finger pins and heat sink bases are bonded together by welding, bristling, or solder.

3. The Kelvin socket of claim 1, wherein the heat sink base has a traverse through hole in the traverse dimension of the heat sink base; wherein when the self-cooling contact fingers are installed in an array form on the housing, the traverse through holes align with each other to form a through path allowing a cooling medium to flow therethrough to cool down the heat sink base, thereby cooling down the self-cooling force contact fingers.

4. The Kelvin socket of claim 3, wherein the heat sink base has a longitudinal channel formed in the longitudinal dimension of the heat sink base, wherein the longitudinal channel runs across the traverse through hole and along the length of the force contact pins.

5. The Kelvin socket of claim 1, wherein the elastomer is made of silicone.

6. The Kelvin socket of claim 1, wherein said components are made up of non-metal material suitably adapted for High Potential (voltage) (HIPOT) testing.

7. A self-cooling force contact finger suitable for being employed in a Kelvin socket, said self-cooling force contact finger comprising:

a force contact finger pin; and a heat sink base being attached to a portion away from tip of the force contact finger pin for dissipating heat from the force contact finger pin.

8. The self-cooling force contact finger of claim 7, wherein the force contact finger pins and heat sink bases are bonded together by welding, bristling, or solder.

9. The self-cooling force contact finger of claim 7, wherein the heat sink base has a traverse through hole in the traverse dimension of the heat sink base.

10. The self-cooling force contact finger of claim 9, wherein the heat sink base has a longitudinal channel formed in the longitudinal dimension of the heat sink base, wherein the longitudinal channel runs across the traverse through hole and along the length of the force contact pins.

* * * * *